United States Patent [19]

Geissler et al.

[11] Patent Number: 4,759,887

[45] Date of Patent: Jul. 26, 1988

[54] APPARATUS AND PROCESS FOR THE MANUFACTURE OF SHAPED BODIES FROM SILICON GRANULATES

[75] Inventors: Joachim Geissler, Stammham; Deiter Helmreich, Burghausen; Roland Luptovits, Emmerting; Maximilian Semmler; Burkhard Walter, both of Burghausen, all of Fed. Rep. of Germany

[73] Assignee: Heliotronic Forschungs- und Entwicklungs-gesellschaft für Solarzellen-Grundstoffe mbH, Burghausen, Fed. Rep. of Germany

[21] Appl. No.: 862,006

[22] Filed: May 12, 1986

[30] Foreign Application Priority Data

May 24, 1985 [DE] Fed. Rep. of Germany ....... 3518829

[51] Int. Cl.[4] ............................................. B29B 9/08
[52] U.S. Cl. .......................................... 264/25; 264/42; 264/85; 264/101; 264/113; 264/125; 264/237; 264/332; 425/73; 425/79; 425/174; 425/174.8 R; 425/341; 425/453
[58] Field of Search ................... 264/22, 6, 25, 42, 85, 264/101, 125, 310, 332, 237, 113; 425/174.8 R, 174, 73, 341, 453, 79; 156/602, 608, 615; 423/348–349

[56] References Cited

U.S. PATENT DOCUMENTS

| | | | |
|---|---|---|---|
| 3,442,321 | 5/1969 | Blum et al. | 425/174.4 |
| 3,484,511 | 12/1969 | Delrieux | 264/25 |
| 3,724,977 | 4/1973 | Lang | 425/72 R |
| 3,744,946 | 7/1973 | Lang | 425/73 |
| 4,005,956 | 2/1977 | Inoue | 425/174.4 |
| 4,012,213 | 3/1977 | Haggerty et al. | 425/174.4 |
| 4,116,598 | 9/1978 | Alexandrov et al. | 425/174.8 R |
| 4,131,659 | 12/1978 | Authier et al. | 264/85 |
| 4,175,610 | 11/1979 | Zauhar et al. | 164/60 |
| 4,218,410 | 8/1980 | Stephan et al. | 264/25 |
| 4,295,808 | 10/1981 | Stephan et al. | 425/174 |
| 4,330,362 | 5/1982 | Zulehner | 156/617 SP |
| 4,358,416 | 11/1982 | Yarwood et al. | 425/174.8 R |
| 4,410,471 | 10/1983 | Gurtler et al. | 264/25 |
| 4,428,783 | 1/1984 | Gessert | 148/172 |
| 4,447,289 | 5/1984 | Geissler et al. | 156/608 |
| 4,572,812 | 2/1986 | Ciszek | 264/25 |

FOREIGN PATENT DOCUMENTS 1145284 10/1960 Fed. Rep. of Germany ........ 264/25
59-129702 7/1984 Japan .................................... 264/25

Primary Examiner—Jeffery Thurlow
Attorney, Agent, or Firm—Collard, Roe & Galgano

[57] ABSTRACT

A process for the manufacture of shaped bodies from silicon granulates for producing silicon melts includes first incipiently melting silicon grains on their surfaces, so that they bond with their neighbors in the process and, after solidifying, form a porous compound shaped body which only then may be melted completely. Such compound shaped bodies can be manufactured continuously or semi-continuously and converted without difficulty by a subsequent step into the molten state. An apparatus for producing shaped bodies is also provided which preferably employs an electron beam, to supply energy to incipiently melt the granulate.

13 Claims, 2 Drawing Sheets

APPARATUS AND PROCESS FOR THE MANUFACTURE OF SHAPED BODIES FROM SILICON GRANULATES

BACKGROUND OF THE INVENTION

The invention relates to a process and apparatus for the manufacture of shaped bodies from silicon granulates for producing silicon melts.

The use of silicon in granular form as the starting material for silicon melts is known. The silicon granulate is placed in suitable receptacles and, by supplying energy, for example by means of resistance, induction, or radiation heating, it is brought to the melting temperature and converted directly into the molten state. In this manner there may be produced, for example, silicon melts for crucible drawing according to Czochralski (cf., for example, U.S. Pat. No. 4,330,362), for the manufacture of from coarse grained to monocrystalline sheets of silicon (cf. U.S. Pat. No. 4,447,829), for drawing silicon strips (cf., for example, U.S. Pat. No. 4,428,783) or for casting silicon blocks of columnar structure (cf., for example U.S. Pat. No. 4,175,610).

The use of silicon in granular form has a number of advantages over the equally feasible melting of lumps of material. For example, silicon granulates can be handled, transported, metered or charged, and optionally subsequently charged, without a great deal of apparatus. A disadvantage is the oxygen content, which results from the unavoidable oxide film on the particles, and occurs at a high level because of the large surface area of the granulate. In addition, it is virtually impossible to avoid the occurrence of extremely troublesome dusts in the melting zone. Furthermore, during the additional charging of silicon melts, relatively large chunks can cause splashes and disturbances in the melt as a result of vibration, or unreliable temperature changes, including those leading to partial solidification, can occur.

It is therefore an object of the invention to provide a process and apparatus for producing silicon melts using silicon granulates as the starting material without the occurrence of the above-mentioned disadvantages.

SUMMARY OF THE INVENTION

The foregoing and related objects are readily attained in a process wherein granulate grains that have been introduced into an incipient melting zone and brought into contact with one another are melted on the surface by supplying energy. The grains are then united to form a compound material which is moved out of the incipient melting zone either cyclically or continuously. In the process the compound material forms a compound shaped body which is caused to melt in a downstream step of the process in a manner known per se.

A silicon granulate that can be used in this process is obtained in large quantities, for example, in the comminution of shaped bodies made of polycrystalline silicon, e.g., tubes or rods, which can be obtained in known manner, for example by the decomposition of chlorosilanes, such as trichlorosilane, on heated carriers. It is advantageous to use a silicon granulate having a grain size in the range of from 1 to 50 mm, i.e. a granulate having grains that pass through a sieve having an inside mesh width of 50 mm, but are retained by a sieve having an inside mesh width of less than 1 mm. It is sometimes advisable to divide the suitable granulate fraction into suitable sub-fractions, for example from 1 to 10, from 10 to 20 and from 20 to 50 mm, in order to be able to precisely adjust and reliably maintain the grain-size distribution finally desired for the manufacture of compound material, by means of controlled metering and mixing of these sub-fractions.

The purity of the silicon granulate used depends fundamentally on the intended product. For example, the silicon basic or base material for the manufacture of electronic components will, as a rule, be selected according to stricter criteria of purity than will the silicon basic or base material for the manufacture of solar cells.

The incipient melting zone can, in principle, be provided inside chambers which allow the supply and accommodation of the silicon granulate, the supply of energy and the continuous or cyclical removal of the compound shaped body constructed from the compound material produced by the bonding together of the granulate grains. Advantageously, the geometry of the boundary walls is made according to the desired cross section of the compound shaped body. As a rule, therefore, incipient melting zones of annular or from square to rectangular or trapezoidal cross section are used, since the compound shaped bodies generally desired are round or square rods. In principle, however, other geometries, for example prism-like geometries, are also possible.

As for the materials for the boundary walls of the incipient melting zone that come into contact with the silicon granulate, materials that can be kept mechanically stable even in the presence of incipiently molten silicon granulate and substantially exclude the possibility of contamination of the silicon granulate have proved to be suitable. For example silicon carbide or, especially, silicon, and also e.g., reaction-bonded material according to DE-OS No. 32 63 276 or the German application with the file reference No. 34 40 346.9. It is, however, possible to line or coat only the inner walls that form the boundary of the incipient melting zone, with these materials, and to manufacture the outer walls from other materials, for example copper or graphite. A wall temperature that prevents the incipiently molten granulate from fusing with the walls is also important. This can be achieved, if necessary, by additional cooling of the walls, for example with a through-flowing cooling medium, such as water or a cooling gas.

The silicon granulate can be supplied using the devices suitable for conveying and metering solids that are familiar to a person skilled in the art, for example shaking troughs, conveyor belts or rotary metering devices. The granulate is preferably transferred continuously to the incipient melting zone from a reservoir, although in principle batchwise charging is also possible.

Although, in principle, methods such as resistance or induction heating may also be considered for supplying the energy required for the incipient melting of the surface of the granulate grains, the energy is preferably supplied by means of an energy beam, such as a laser or, especially, an electron beam. These forms of energy supply make the incipient surface melting of the granulate grains easier and thus accelerate the decomposition of the oxide film on the grains, and hence the removal of the troublesome oxygen.

The choice of energy source also affects the working atmosphere, which is to be provided in the incipient melting zone, and which is inert with respect to silicon. Use of an inert gas atmosphere, for example argon, is possible when using resistance or induction heating. However, when using the preferred energy radiation, especially electron radiation, a vacuum which is as good as possible should assuredly be provided. Advantageously, the vacuum should be better than approximately $10^{-2}$ mbar, and preferably from $10^{-3}$ to $10^{-5}$ mbar.

In order to prevent the undesired formation of completely molten or unmelted areas in the silicon granulate in the incipient melting zone, it is advantageous for the energy supplied to be distributed as uniformly as possible over the free surface of the melting zone. Also, in the case of the preferred energy beams, especially electron beams, the object, as a rule, should be to ensure by means of suitable adjustment and metering, that the energy supplied in the marginal area of the incipient melting zone causes the granulate grains to start to melt on the surface, without causing them to melt completely in the center. In principle, when the energy is supplied by means of energy radiation, especially electron radiation, the surface area that is irradiated does not need to be equal to the total free surface area of the silicon granulate in the incipient melting zone.

In general, in order to incipiently melt the surface of the granulate grains, an amount of energy is required that is approximately from 20 to 60% of the amount that would be required to completely melt the corresponding amount of silicon. (The amount of energy required to bring the temperature up to the melting temperature from the ambient temperature and compensation for any energy losses that might occur, for example as a result of thermal radiation, should also be taken into account.) The amount of energy to be supplied per unit of time can thus be estimated from the amount of silicon granulate supplied per unit of time. It has often proved successful to supply more than that amount of energy in the initial phase, possibly even over 60%, and to later reduce the supply when the bonding together of the granulate grains is well under way. It is advantageous to determine empirically, by means of preliminary tests, the amount of energy, within the predetermined range, that is most suitable in each case. This amount of energy is sufficient to provide enough molten material to bond together the granulate grains, but on the other hand, is not so great that there is a danger that the melt will escape.

The granulate grains introduced into the incipient melting zone are at first loosely in contact in the zone, as they fall, but are not yet bonded to one another. As soon as a few grains begin to melt at the surface under the action of the energy supplied, the bonding with adjacent grains begins via wetting. It proceeds constantly as the number of grains incipiently melted on the surface increases, until a coherent but still porous compound material has formed. In this phase, as a rule, the majority of the grains in the incipient melting zone are covered wholly or at least partially with a molten layer. When the compound material that is incipiently melted in this manner leaves the incipient melting zone, the molten areas of the granulate grains solidify again and the material hardens into a stable porous compound shaped body.

During its passage through the incipient melting zone, the freshly introduced granulate in the marginal area also comes into contact with the boundary walls of the incipient melting zone. However, the material contracts slightly during the incipient melting and coalescence of the grains, with the result that at this stage virtually no contact can be detected between the granulate and the boundary walls. Surprisingly, it was found, that even during the subsequent solidifying process, in spite of the increase in volume of approximately 10% that is known to occur with silicon, no further contact takes place with the boundary walls. As a result, the compound shaped body that is formed can be moved out of the incipient melting zone without any difficulty.

It is therefore possible to carry out the process continuously or semi-continuously if the amount of material introduced into the incipient melting zone and the bonded material removed therefrom are suitably matched. In this manner it is possible to especially obtain rods of round or from rectangular to square cross section and, in principle, of any length, that are preferably used for later complete melting.

The compound shaped body obtained has a higher density than does the silicon granulate that is introduced initially. Experience has shown that an increase in density of as little as approximately 20%, based on the bulk density of the starting material, allows the compound shaped body to achieve sufficient mechanical and thermal stability. On the other hand, its density should preferably be below 1.86 g/cm$^3$, that is to say not more than 80% of the density of solid silicon, as above this value the porosity is in general not sufficient to compensate for mechanical or thermal stresses without the formation of cracks or splits. The density of the resulting material can be controlled above all by means of the bulk density of the starting material, the amount of energy supplied and the rate at which the material passes through the incipient melting zone.

Other objects and features of the present invention will become apparent from the following detailed description considered in connection with the accompanying drawings, which disclose several embodiments of the invention. It is to be understood that the drawings are to be used for the purpose of illustration only, and not as a definition of the limits of the invention.

BRIEF DESCRIPTION OF THE DRAWINGS

In the drawings, wherein similar reference characters denote similar elements throughout the several views.

DETAILED DESCRIPTION OF THE PREFERRED EMBODIMENTS

Figure 1:
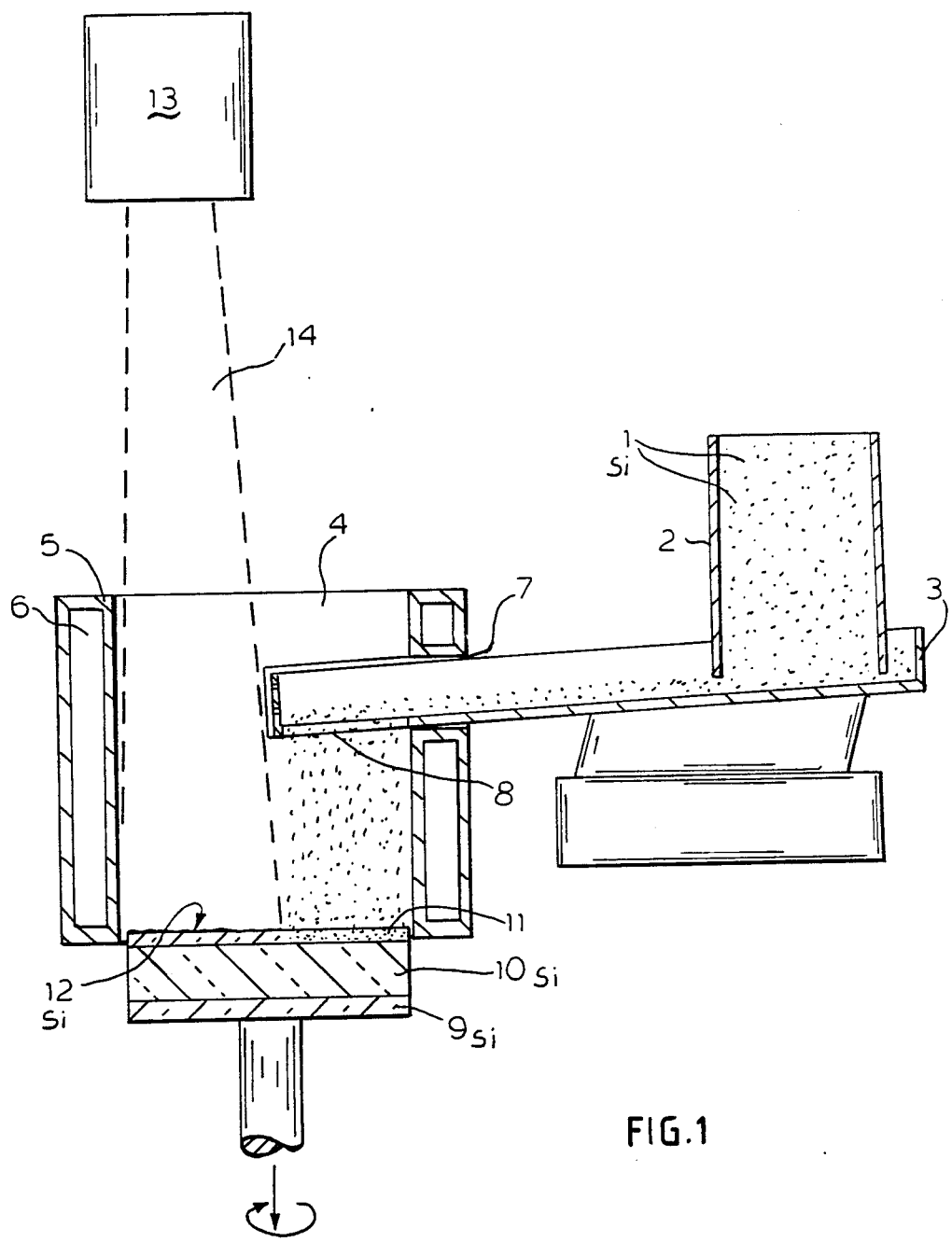
FIG. 1 is a schematical sectional representation, in part elevation, of one embodiment of the apparatus for carrying out the process of the invention in which compound shaped bodies in the form of round rods can be manufactured semi-continuously.

Turning now in detail to the appended drawings, therein illustrated is a novel method and apparatus for the manufacture of shaped bodies from silicon granulates, embodying the present invention, wherein, as shown in FIG. 1, silicon granulate 1 that has optionally been purified, for example, by treatment with an acid, and is of the desired grain size, is placed in readiness in a granulate chamber 2 from which it is metered by means of a shaking channel or trough 3 into an incipient melting chamber 4.

Incipient melting chamber 4 comprises a conductive ring 5 made of e.g., copper, and coated on the inside with, for example, silicon. Ring 5 has interior channels 6 through which a cooling medium such as water or a cooling gas can be conducted. Through an opening 7 shaking trough 3 radially projects into the inside of incipient melting chamber 4, advantageously over a distance corresponding to from 65 to 90% of the radius of the chamber. Shaking trough 3 continuously releases onto a charging section 8 the granulate grains that have been carried forward from granulate chamber 2. These granulate grains 1 trickle downwardly and are deposited on the surface of a section 10 of compound shaped body, consisting of already bonded granulate, which is resting on a piston or platform 9. Piston 9 is made of a high temperature resistant material such as silicon or silicon carbide, and it can be rotated and lowered. Advantageously piston 9 is rotated at from 10 to 60 revolutions per minute. Granulate 1 is deposited on section 10 in such a manner that a uniform bulk height is obtained over the sector surface. Because of the rotational movement of piston 9 and section 10 thereon, the granulate 11 applied to its surface then passes into the actual incipient melting zone 12, an area on the surface of the rotating section 10 of compound shaped body that is irradiated by an energy beam, preferably an electron beam 14, originating from a radiation source 13. The size of this melting zone area is advantageously selected so that only approximately from 50 to 70% of the whole end face of section 10 of compound shaped body 10 is exposed to the radiation.

It is, of course, also conceivable to use other arrangements in which the beam acts not only on some areas, but on the entire free end face of the granulate. Other methods of introducing the granulate, for example by means of rotational metering devices, and other designs of incipient melting chambers, for example designs with sloping inner walls, or a different design of the incipient melting zone, e.g., a zone in the form of a funnel inclined downwards towards the middle, are also in principle not excluded.

In incipient melting zone 12, the grains 11 that have been introduced are melted incipiently on the surface with the aid of the radiant energy. As a result, adjacent grains bond both with one another and with the compound material already produced that lies underneath them. As the incipiently melted grains leave the irradiated area, newly introduced granulate produces a granulate layer which draws heat from the covered compound material, accelerates its crystallization and in the process is itself brought to an elevated temperature. As a result, the bonding of the covered granulate grains to one another and to the substrate is stabilized.

As it passes through the path of the beam, the newly applied granulate layer is analogously incipiently melted and bonded. In this way, the compound shaped body 10 grows as the supply of granulate proceeds. If rotating piston 9 is lowered according to this rate of growth, the incipient melting zone always remains substantially at the same level inside the incipient melting chamber. As a result, it is also possible to prevent the uppermost growth edge from growing too far into the incipient melting chamber and thereby possibly hindering the rotation.

When the compound shaped body has reached the desired length, the supply of granulate and energy is stopped and the resulting round rod can be removed and brought to the desired place of use, in order to be finally melted. Such round rods are frequently made with a diameter of approximately from 50 to 150 mm and a length of from 200 to 400 mm. These measurements are, however, only by way of example and are not to be understood as a limitation.

If the round rods obtained in such a manner are to be joined together, for example fused together, to form relatively large rod units before being finally melted, it has often proved successful to provide complementary projections and recesses in their top end and base surfaces, for example a peg and a matching hole or the like, in order to facilitate the bonding of the rods. This procedure is especially recommended when in the case of the semi-continuous manufacture of rod components, the final melting is to be carried out continuously.

The arrangement shown in FIG. 1 is surrounded by a receiver, made of e.g., stainless steel, (which for clarity is not shown) which allows the appropriate working atmosphere to be established and maintained. A vacuum of from $10^{-3}$ to $10^{-5}$ mbar, which allows the unavoidable high oxygen content, (caused mainly by the fact that the granulate is manufactured and stored in air) to be significantly reduced, has proved especially advantageous. During the incipient melting process, the oxide film covering the granulate grains is destroyed, and the oxygen is able to evaporate in the form of volatile silicon monoxide.

Figure 2:
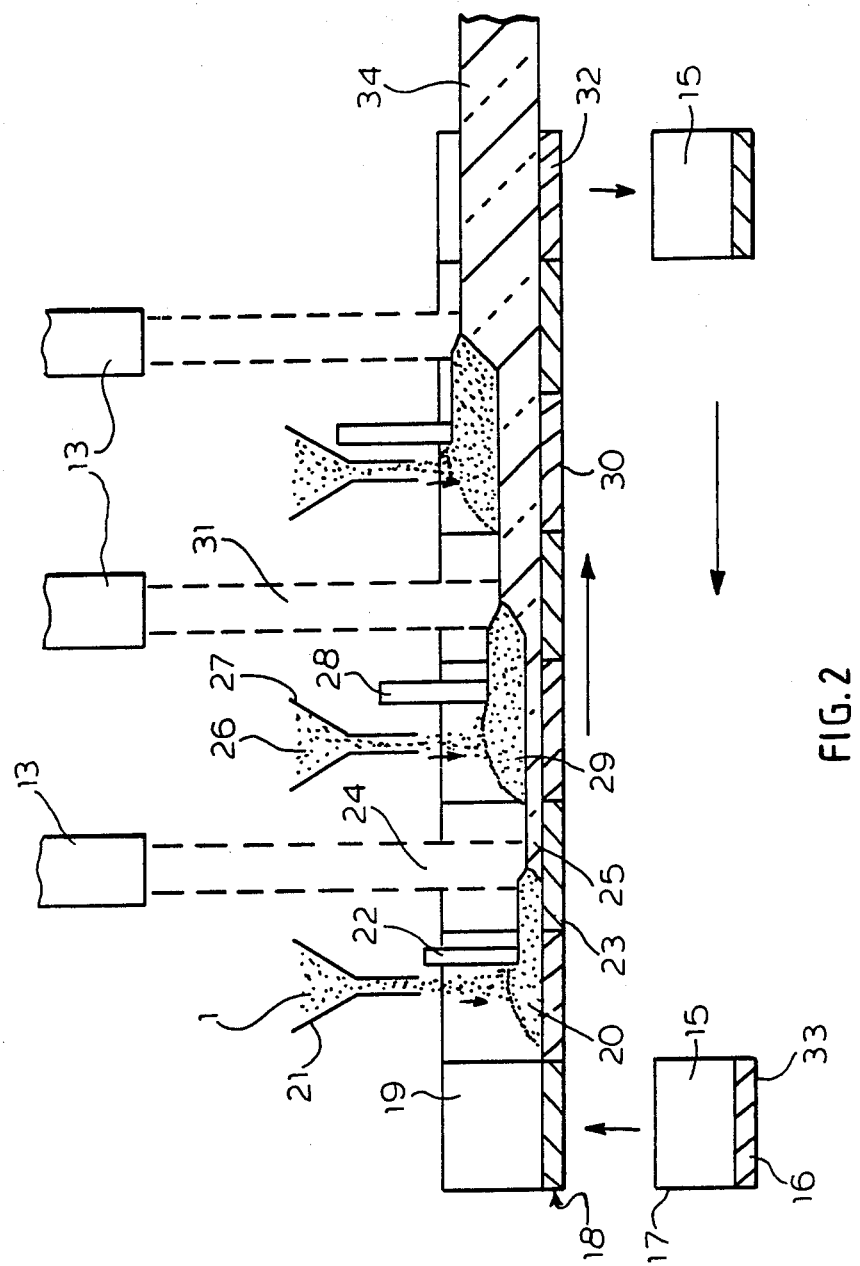
FIG. 2 is a schematical representation of another embodiment of the invention wherein compound shaped bodies of trapezoidal or from rectangular to square cross section are continuously manufactured.

The compound shaped body can be moved out of the incipient melting zone not only substantially parallel to the direction in which the silicon granulate is introduced, (as shown in FIG. 1, i.e., substantially vertically) but also substantially perpendicular thereto, i.e., substantially horizontally, as shown in the embodiment illustrated in FIG. 2. This process is especially suitable for a layer by layer build up of the compound shaped body by means of a plurality of successive charging and incipient melting steps.

The silicon granulate introduced in the embodiment of the process illustrated in FIG. 2 may be received in, e.g., suitable trough-like mold elements 15 made, for example, from graphite or silicon. Mold elements 15 are open in the longitudinal direction. The bottom wall or floor 16 and the two side walls 17 are designed so that they can be fitted together in a row to form a conveying line 18. The inside of the trough can have, for example, a rectangular, square or, advantageously, a trapezoidal cross section that widens towards the top. It is advantageously coated or lined with materials such as silicon or silicon carbide. The mold elements 15 lined up to form conveying line 18 initially move to a first charging station 19 where they pick up a first granulate layer 20 of silicon granulate 1 released by a metering device 21. This first granulate layer 20 may be rendered uniform with the aid of a doctor blade 22 before it can be incipiently melted on the surface and united to form a compound layer 25 in a first incipient melting zone 23, for example using an electron beam 24. During or after solidification, this compound layer 25 passes into the next charging station 26 having a metering device 27 and optionally a doctor blade 28, where it is covered with a further layer 29 of granulate. Layer 29 is then conjoined and at the same time bonded to the lower existing compound layer 25 in an incipient melting station 30, for example using an electron beam 31, in an analogous manner by incipient melting of the surface of the granulate grains.

This process consisting of charging, optional levelling, subsequent incipient melting of the surface, and bonding and solidifying of the granulate grains, can be repeated until the desired level is reached in conveying line 18, thereby also obtaining the desired shape of the compound shaped body. From end position 32, the mold elements 15 can be finally lowered, returned to starting position 33 and lined up again to form conveying line 18. The rod-like compound shaped body 34 that is obtained continuously can then be introduced, for example, into an incipient melting station (not shown) and melted, starting from the end. The silicon melts obtainable continuously in this manner can be used especially advantageously in the manufacture of from coarse grained to monocrystalline silicon sheets according to U.S. Pat. No. 4,447,289.

In principle, it is also possible, for example, to use arrangements in which not the whole of the mold elements 15 are designed to be movable, but in which the side walls are fixed and only the bottom walls are moved along in the manner of a conveyor belt. Also conceivable are, for example, devices in which a conveying element, for example a trough-like conveying element, is loaded repeatedly layer by layer and an incipient melting zone passes through it.

It has often proved successful to introduce a silicon granulate fraction having a relatively small grain size, for example from 1 to 10 mm, to the first charging station and to increase the grain size at the following charging stations. As a result, the granulate grains of relatively large size, for example from 20 to 50 mm, are not added until towards the end of the manufacturing process.

In general, in the first incipient melting station a relatively large amount of energy is required to incipiently melt the surface of the charged silicon granulate, as compared with the following stations in which energy is already supplied to the newly charged material by the previously incipiently melted and already bonded granulate. The most suitable amount of energy to supply in each case is advantageously determined empirically using preliminary tests, in accordance with the metering rate of the granulate, and within the range of from 20 to 60% of the amount of energy required for the complete melting of a corresponding amount of granulate.

Instead of the arrangement shown in FIG. 2 wherein each melting station has an associated radiation source, embodiments in which a movable energy source serves several melting stations are also conceivable.

In order to produce a suitable working atmosphere, the whole arrangement is accommodated in a receiver which is not shown for reasons of clarity. Advantageously, a vacuum of from $10^{-3}$ to $10^{-5}$ mbar is established in order, as explained above, to keep the oxygen content of the resulting compound shaped body at a low level.

The process according to the invention for melting silicon granulate in which initially, before the actual melting step, a compound shaped body is made from the granulate, is suitable especially for uses in which a continuous flow of molten silicon is required over a long period of time, such as, for example, in the already mentioned manufacture of sheets or strips of silicon. In addition, the use of preliminary shaped bodies in the form of round rods as a supply rod for zone pulling is also conceivable. Further possible uses can be found, as previously mentioned, e.g., in the crucible pulling according to Czochralski, and when casting silicon blocks of columnar structure. In these processes the final melting process used may be one of the melting methods that are known and familiar to a person skilled in the art, for example those used for the melting of mono- or poly-crystalline silicon rods, e.g., melting using resistance, induction, or radiation heating.

The invention will now be explained more fully in a number of examples which are, however, only given by way of illustration and not of limitation.

EXAMPLE 1

In an arrangement corresponding to FIG. 1, 1.2 kg of silicon granulate purified by treatment with an acid (particle size 1-15 mm, bulk density approximately 1 g/cm$^3$, oxygen content > $10^{18}$ atoms/cm$^3$) was placed in readiness and was introduced as required into the incipient melting chamber by way of a shaking trough. The chamber comprised a water-cooled copper ring (internal diameter approximately 80 mm, height of sides approximately 50 mm) coated on the inside with silicon carbide, which was closed off on its underside by a rotatable and lowerable piston made of silicon carbide. From the open top side, approximately 60% of the surface of the piston could be irradiated with an electron beam from an electron beam gun. There was a vacuum of approximately $10^{-4}$ mbar in the system.

By means of beam deflection control, the energy distribution of the electron beam could be so adjusted that when the piston was rotated the amount of energy radiated onto each element of the surface during its passage through the path of the beam was approximately the same. As a result, an approximately uniform melting pattern from the middle to the edge of the charged silicon granulate on the rotating piston was also ensured.

For the actual manufacture of the preliminary shaped body the piston was first set in a rotating and lowering motion (approximately 12 rpm, lowering speed approximately 2 mm/sec) and loaded with a silicon granulate (charging rate approximately 10 g/sec) until a height of approximately 10 mm was reached. The electron beam was then switched on and the incipient melting process was commenced. The power radiated onto the granulate during the first revolution was approximately 17 kW; it was then reduced gradually to a value of approximately 12 kW, corresponding to approximately 30% of the power required for the complete melting of the silicon granulate.

The energy supply caused layer-like areas of molten silicon to form at least in places on the surface of the individual granulate grains. These areas gradually fused with adjacent granulate grains in the area of contact. As a result, there finally was formed a structure containing many cavities made of grains bonded to one another in places. The structure was removed from the exposure of the electron beam by the rotary movement and simultaneously covered with freshly added granulate. As a result it cooled and was caused to solidify. The lowering rate of the rotating piston and the resulting compound material thereon was set at approximately 2 mm/sec. In this manner, the incipient melting zone, i.e., the zone in which the material is in an incipiently melted state, remained permanently in the lower end region of the conductive ring. Therefore, the growth edge neither projected too far into the inside of the incipient melting chamber nor moved out of it.

After approximately 2 minutes, the compound shaped body formed had reached a length of approximately 200 mm, the addition of granulate was stopped, and the electron beam was switched off. The resulting round rod (density approximately 1.3 g/cm$^3$, oxygen content < $10^{17}$ atoms/cm$^3$) could, by virtue of its porous structure, be removed without the risk of disintegration due to thermal stresses. The rod was transferred to the melting region of an installation for the manufacture of from coarse grained to monocrystalline sheets of silicon (according to U.S. Pat. No. 4,447,289) where it was finally completely melted little by little, starting from one end, by means of an electron beam. The piston was returned to its starting position, so that, in order to produce another round rod, silicon granulate could again be charged into the incipient melting chamber.

EXAMPLE 2

This Example shows, with reference to the apparatus and procedure explained in connection with FIG. 2, the layer by layer manufacture of a preliminary shaped body which is of rectangular cross section and in each case is moved out of the incipient melting zone in a horizontal direction.

In a receiver evacuated to $10^{-4}$ mbar, an approximately 10 mm thick layer of silicon granulate of grain size 5-15 mm (bulk density approximately 1 g/cm$^3$) was introduced from a charging station into a silicon trough having inside dimensions of 200×80 ×50 mm.

An area of 80×20 mm of the contents of the trough was irradiated using an electron beam gun until the granulate was caused to incipiently melt on the surface. When the radiation began, the trough was set in horizontal linear motion at approximately 12 mm/sec, with the result that, with the electron beam in a constant position, the incipient melting zone passed gradually over the entire contents of the trough. The power of the electron beam was 16 kW.

During this first pass, a further layer of granulate, approximately 10 mm thick, and of the same grain size was charged directly onto the contents of the trough emerging from the incipient melting zone, which contents were incipiently melted on the surface and were hardening to form a compound material. At the end of the first pass, the incipient melting zone also passed over this second layer, as a result of the relative movement between the trough, and the electron beam and charging station. After the incipient melting process, this second layer was covered with a third layer of granulate, approximately 10 mm thick. During this process, the granulate of the second layer was bonded together and to the material underneath it, which had already bonded in the first pass. At the same time the already bonded second layer material preheated the third layer. The power of the electron beam could be reduced to 12 kW.

The process was repeated until, after a final pass of the incipient melting zone without further subsequent charging of granulate, a cubic compound shaped body (dimensions 200×80×40 mm, density 1.3 g/cm$^3$, oxygen content below the detection limit of $10^{17}$ atoms/cm$^3$) was present in the trough, and could be removed without difficulty.

The resulting compound shaped body could be melted completely, starting from one end, and using an electron beam, a smooth, uniform melt flow was obtained with no fragments breaking off.

Thus, while several embodiments and examples of the present invention have been shown and described, it is obvious that many changes and modifications may be made thereunto, without departing from the spirit and scope of the invention.

What is claimed is:

1. A process for manufacturing shaped bodies from a silicon granulate for producing silicon melts, comprising the steps of:

introducing silicon grains into an incipient melting zone;

supplying energy to the grains in said incipient melting zone thereby causing said grains to melt on the surface and bond with adjacent grains via wetting, so as to form a coherent but still porous compound material; and removing the compound material from said incipient melting zone thereby hardening the material into a stable porous compound shaped body.

2. The process according to claim 1, further comprising the step of completely melting the compound material shaped body removed from the melting zone in a subsequent downstream silicon processing operation.

3. The process according to claim 1, wherein a vacuum of at least $10^{-2}$ mbar is established in the incipient melting zone.

4. The process according to claim 1, wherein the grains have a grain size of from approximately 1 to 50 mm.

5. The process according to claim 1, wherein an amount of energy that corresponds to approximately from 20 to 60% of the amount of energy required to melt the grains completely is supplied to the grains introduced into the incipient melting zone.

6. The process according to claim 1, wherein the shaped body has a density that is at least 20% higher than the bulk density of the grains introduced and at most 80% of the density of solid silicon.

7. The process according to claim 1, wherein the shaped body is built up layer by layer to the desired thickness.

8. The process according to claim 1, wherein the energy is supplied by at least one energy beam.

9. The process according to claim 7, wherein the energy is supplied by at least one electron beam.

10. The process according to claim 1, wherein silicon grains are continuously introduced into the incipient melting zone and the compound material is continuously moved out of the incipient melting zone.

11. The process according to claim 1, wherein silicon grains are cyclically introduced into the incipient melting zone and the compound material is cyclically moved out of the incipient melting zone.

12. An apparatus for producing shaped bodies from silicon grains which comprises:

a sealable receiver containing an incipient melting chamber, a piston associated with and rotatably and axially displaceably disposed below said chamber, and charging means for supplying silicon grains into said chamber;

grain supply means;

metering means for metering a flow of grains from said grain supply means to said charging means; and energy supplying means for supplying energy to said grains in said melting chamber.

13. An apparatus for producing shaped bodies from silicon grains which comprises:

a sealable receiver containing a plurality of adjoining melting stations each including a melting zone, a silicon grain storage chamber, metering means for metering a flow of grains from said storage chamber to said melting zone, and energy supplying means for supplying energy to said melting zone; and a plurality of trough-like mold elements capable of being fitted together and conveyed through said melting stations.

* * * * *